United States Patent
Schmid et al.

(10) Patent No.: US 7,816,163 B2
(45) Date of Patent: Oct. 19, 2010

(54) RADIATION-EMITTING SEMICONDUCTOR BODY FOR A VERTICALLY EMITTING LASER AND METHOD FOR PRODUCING SAME

(75) Inventors: Wolfgang Schmid, Hillohe (DE); Klaus Streubel, Laaber (DE); Norbert Linder, Wenzenbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 29 days.

(21) Appl. No.: 12/240,147

(22) Filed: Sep. 29, 2008

(65) Prior Publication Data

US 2009/0029496 A1  Jan. 29, 2009

Related U.S. Application Data

(62) Division of application No. 11/210,263, filed on Aug. 23, 2005, now Pat. No. 7,443,898.

(30) Foreign Application Priority Data

Aug. 31, 2004 (DE) ........................ 10 2004 042 510
Aug. 4, 2005 (DE) ........................ 10 2005 036 820

(51) Int. Cl.
*H01L 21/00* (2006.01)
(52) U.S. Cl. .............................. 438/47; 438/29; 438/31; 438/34; 438/35; 438/45; 438/46
(58) Field of Classification Search .................. 438/29, 438/31, 34, 35, 45–47
See application file for complete search history.

(56) References Cited

U.S. PATENT DOCUMENTS

| 5,291,502 A | 3/1994 | Pezeshki et al. |
| 5,835,516 A * | 11/1998 | Miyashita et al. ........ 372/46.01 |
| 5,837,561 A | 11/1998 | Kish et al. |
| 5,994,723 A | 11/1999 | Sekii et al. |
| 6,256,331 B1 * | 7/2001 | Kitoh et al. ............... 372/46.01 |
| 6,304,587 B1 * | 10/2001 | Zah .......................... 372/46.01 |
| 6,333,946 B1 * | 12/2001 | Miyashita et al. ........ 372/46.01 |
| 6,778,582 B1 | 8/2004 | Mooradian |
| 2002/0179929 A1 * | 12/2002 | Takahashi et al. ........... 257/184 |

(Continued)

FOREIGN PATENT DOCUMENTS

WO    WO 02/13334    2/2002

(Continued)

OTHER PUBLICATIONS

German Search Report for Application No. 10 2005 036 820.4-54 dated Oct. 24, 2007.

(Continued)

*Primary Examiner*—Kevin M Picardat
*Assistant Examiner*—Bac H Au
(74) *Attorney, Agent, or Firm*—Fish & Richardson P.C.

(57) ABSTRACT

The present invention concerns a radiation-emitting semiconductor body with a vertical emission direction, a radiation-generating active layer, and a current-conducting layer having a current-blocking region and a current-permeable region, the semiconductor body being provided for a vertically emitting laser with an external resonator, and the external resonator having a defined resonator volume that overlaps with the current-permeable region.

19 Claims, 2 Drawing Sheets

U.S. PATENT DOCUMENTS

| | | |
|---|---|---|
| 2003/0022406 A1 | 1/2003 | Liao et al. |
| 2003/0048824 A1 | 3/2003 | Shinagawa et al. |
| 2003/0123495 A1 | 7/2003 | Cox |
| 2003/0185267 A1 | 10/2003 | Hwang et al. |
| 2004/0017835 A1* | 1/2004 | Jewell et al. ............... 372/45 |
| 2004/0136433 A1 | 7/2004 | Kuznetsov |
| 2004/0185589 A1* | 9/2004 | Ishikawa et al. ............ 438/47 |
| 2005/0025206 A1 | 2/2005 | Chen |

FOREIGN PATENT DOCUMENTS

| | | |
|---|---|---|
| WO | WO 2004/064211 | 7/2004 |

OTHER PUBLICATIONS

European Search Report dated Dec. 14, 2005.

Urban Eriksson et al., "A Novel Technology for Monolithic Integration of VCSELs and Heterojunction Bipolar Transistors (HBTs) at 1.55 □m", CLEO Pacific Rim '97, Ciba, Japan (1997).

Y. Qian et al, "High Performance 1.3 □m Vertical-Cavity Surface-Emitting Lasers with Oxygen-Implanted Confinement Regions and Wafer-Bonded Mirrors", TuB2, LEOS Summer Topical Meetings, Montreal, Canada (1997).

* cited by examiner

RADIATION-EMITTING SEMICONDUCTOR BODY FOR A VERTICALLY EMITTING LASER AND METHOD FOR PRODUCING SAME

CROSS REFERENCE TO RELATED APPLICATION

This application is a divisional, and claims benefit under Section 120, of U.S. patent application Ser. No. 11/210,263, filed Aug. 23, 2005 now U.S. Pat. No. 7,443,898, which claims priority to German Application No. 10 2004 042 510.8, filed Aug. 31, 2004, and German Application No. 10 2005 036 820.4, filed Aug. 4, 2005. The contents of the prior applications are incorporated herein by reference in their entirety.

BACKGROUND

The present invention relates to a radiation-emitting semiconductor body with a vertical emission direction.

A radiation-emitting semiconductor laser of this kind is known for example from the document WO 02/13334 A2. Described therein is a vertically emitting laser in the form of a so-called VCSEL (Vertical Cavity Surface Emitting Laser). This VCSEL comprises a semiconductor body with a laser resonator formed by two resonator mirrors and with, inter alia, an active layer and a current constricting layer disposed in the laser resonator. The current constricting layer serves in operation to concentrate the operating current on a small subarea of the active layer in order to create in that subarea the population inversion necessary for laser operation.

Such surface-emitting VCSELs excel in terms of their high radiation quality, but have a comparatively low optical output power. In addition, as described in the above-cited document, the current conduction must be well defined, since otherwise, due to the proximity of the current path and the laser resonator volume, combined with the comparatively small lateral expansion of a semiconductor laser of this kind, the electrical heat losses could have a negative impact on beam quality and stability.

It is further known to increase optical output power by providing, instead of a laser resonator integrated into the semiconductor body, a resonator equipped with an external resonator mirror. Such devices are also known as VECSELs (Vertical External Cavity Surface Emitting Lasers). Such semiconductor lasers having an external resonator usually exhibit far greater lateral expansion than a VCSEL and are operated at correspondingly higher powers. Thus, the diameter of a VECSEL is typically in the range of 10 µm or above. Due to the large difference in lateral dimensioning, designs for the conduction of operating current in a VCSEL usually cannot be transposed to a VECSEL.

SUMMARY

In certain embodiments, it is an object of the present invention to create a semiconductor body for a vertically emitting laser with high output power and improved current conduction. The semiconductor body is further intended to be producible with very little technical expenditure. In addition, in certain embodiments, it is an object of the present invention to specify a corresponding vertically emitting laser and a production method for an inventive semiconductor body.

In one aspect, a radiation-emitting semiconductor body with a vertical emission direction is disclosed that includes a current-conducting layer and a radiation-generating active layer, wherein the current-conducting layer includes a current-blocking region and a current-permeable region. The semiconductor body can be provided with an external resonator to form a vertically emitting laser in which the external resonator has a defined resonator volume that overlaps with the current-permeable region in the current-conducting layer of the semiconductor body.

Due to the adaptation of the current-conducting layer to the resonator volume defined by the external resonator, the operating current is conducted to a region suitable for generating radiation within the resonator volume. This makes it possible for the operating current to be coupled in through an electrical contact disposed outside the resonator volume, so that, on the one hand, this contact does not hinder the outcoupling of radiation, and, on the other hand, the current conduction is certain to be advantageous for efficient laser operation.

Accordingly, in a preferred embodiment, the semiconductor body is provided with a radiation output face and, on said radiation output face, a defined radiation output region, an electrical contact for impressing the operating current being disposed in the semiconductor body outside this radiation output region. The current-blocking region of the current-conducting layer is preferably disposed after the electrical contact in the vertical direction, thereby preventing any flow of current outside the resonator volume of the external resonator that would contribute inefficiently or not at all to the production of radiation.

In an advantageous improvement, the current-blocking region is formed by at least one pn junction which in operation is a blocking pn junction. Such blocking pn junctions can be produced with comparatively little technical expenditure.

To this end, the current-conducting layer is preferably disposed between two cladding layers of a first conduction type and is of a second conduction type in the current-blocking region. In this arrangement, the current-conducting layer forms a pn junction in the current-blocking region in combination with each of the adjacent cladding layers, the forward directions of these pn junctions being mutually opposite and thus preventing current flow through the current-blocking region. Conversely, in the current-permeable region the current-conducting layer is of the first conduction type, and thus no blocking pn junctions are disposed in that region.

The current-conducting layer is preferably doped in the current-permeable region with dopants of the first and second conduction types. This facilitates the production of a corresponding semiconductor body, since the current-conducting layer can first be doped throughout with dopants of the second conduction type. The current-conducting layer is subsequently doped specifically in the current-permeable region with a dopant of the first conduction type in such fashion that the doping of the first conduction type predominates and the conduction type is reversed, so that the current-permeable region as a whole is of the first conduction type.

In an advantageous refinement, a mirror structure designed to constitute one end of the external resonator is additionally disposed in the semiconductor body. The mirror structure can be implemented for example as a Bragg mirror. This simplifies the construction of the external resonator, because only one external mirror is necessary in addition to the semiconductor body.

The external resonator mirror is preferably a concavely curved mirror through which, further preferably, the laser radiation is coupled out. If the radius of curvature is suitably sized to the length of the resonator, such a resonator displays an advantageously higher stability compared to a Fabry-Perot resonator with planar resonator mirrors.

Further provided in the present disclosure is a vertically emitting semiconductor laser with an external resonator that contains a semiconductor body with a vertical emission direction.

To produce the semiconductor body, according to one or more embodiments of the present invention, the semiconductor body is fabricated by an epitaxy process in which a first cladding layer of a first conduction type, the current-conducting layer of a second conduction type and a second cladding layer of the first conduction type are sequentially grown, and the current-conducting layer is subsequently doped with a dopant within the current-permeable region in such a way that the current-permeable region is of the first conduction type.

A production method of this kind requires comparatively little technical expenditure, since only structured diffusion within the current-permeable region is necessary in addition to the epitaxial growth of the semiconductor layers.

Preferably, in order to dope the current-permeable region, a dopant source comprising the dopant concerned is applied in a structured manner to the second cladding layer in a region that is disposed after the current-permeable region in the vertical direction, and the dopant is subsequently diffused into the current-permeable region. After the diffusion process, the dopant source can be removed.

Additional features, advantages and applications of the invention will emerge from the following description of two exemplary embodiments in conjunction with FIGS. 1 and 2.

BRIEF DESCRIPTION OF DRAWINGS

Like or like-acting elements are provided with the same reference characters in the figures.

DETAILED DESCRIPTION

Figure 1:
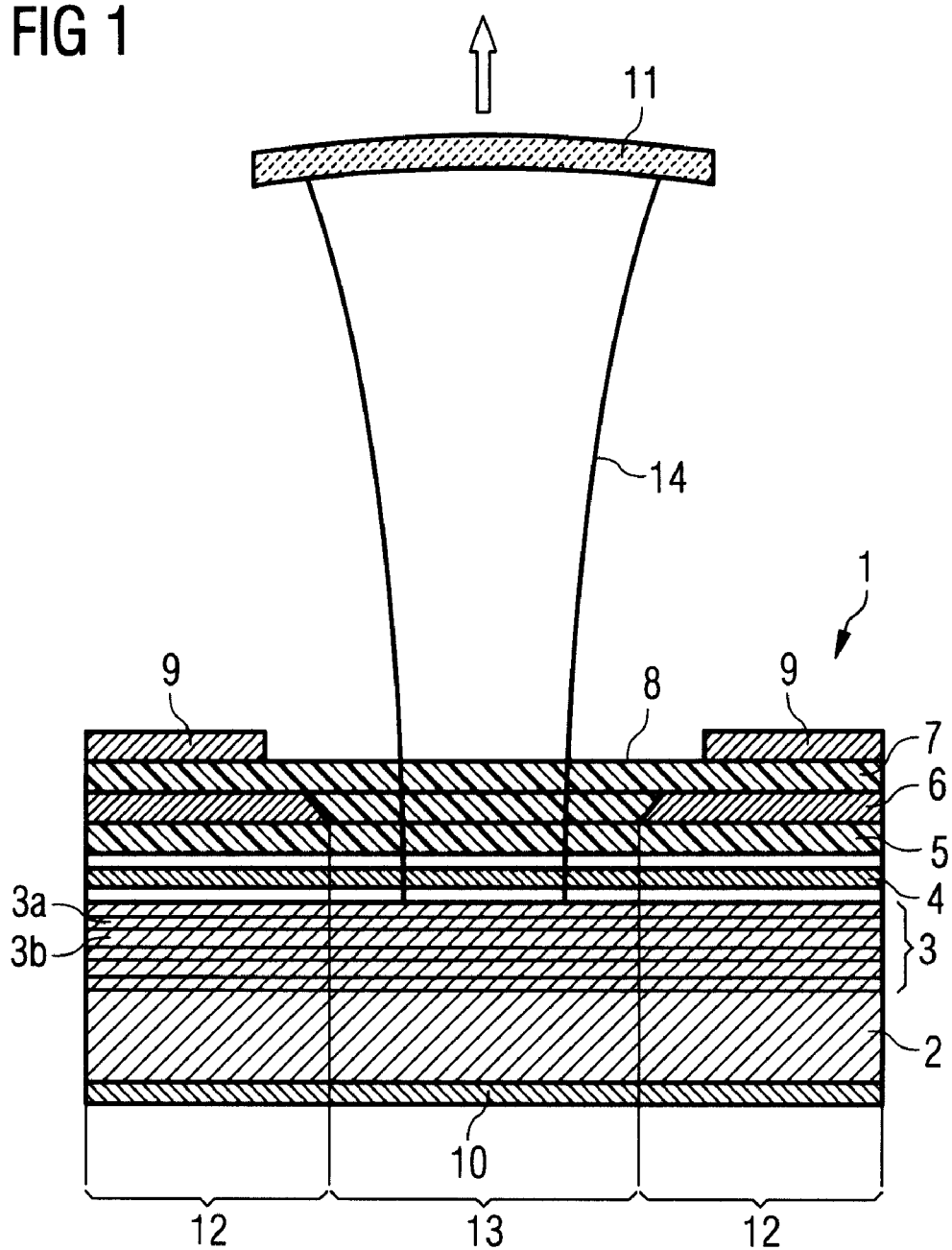
FIG. 1 is a schematic sectional view of an exemplary embodiment of an inventive semiconductor body or inventive semiconductor laser.

The exemplary embodiment depicted in FIG. 1 comprises a semiconductor body 1 that includes, viewed in the vertical direction, a substrate 2, a mirror layer 3, an active layer 4, a first cladding layer 5, a current-conducting layer 6 and a second cladding layer 7. Formed on the radiation-decoupling face 8 of the semiconductor body is a first electrical contact 9, preferably in the form of a ring contact. Correspondingly, a continuous electrical contact 10 is disposed on the opposite face of the semiconductor body.

The laser resonator is formed by the mirror layer 3 and an external mirror 11, preferably with a curved mirror surface. Mirror layer 3 can be implemented in a manner known per se as a Bragg mirror with a plurality of alternating semiconductor layers having different indexes of refraction. A suitable material system for such layers is, for example, GaAs/AlGaAs, the layer sequence being composed of layer pairs 3a, 3b of different aluminum concentrations. Alternatively, mirror structure 3 can also be a metal mirror or a dielectric mirror, in which case substrate 2 can advantageously be omitted. Moreover, in the case of a metal mirror, this mirror can simultaneously be used as contact 10.

Current-conducting layer 6 is disposed between two cladding layers 5 and 7 of a first conductor type and is also of the first conductor type in current-permeable region 13. In the current-blocking regions 12, on the other hand, current-conducting layer 6 is of a second conductor type, so that, viewed in the vertical direction, two pn junctions that prevent vertical current flow in current-blocking region 12 are formed with the adjacent cladding layers 5 and 7.

Substrate 2 can be provided for example as a n-doped GaAs substrate on which a n-doped GaAs/AlGaAs Bragg mirror is grown.

Active layer 4 is preferably fashioned as a single quantum well (SQW) or multiple quantum well (MQW) structure. Such quantum well structures ordinarily comprise one (SQW) or more (MQW) quantum well layers arranged between barrier layers. For example, the quantum well structures can contain InGaP, InGaAs or GaAs quantum well layers and/or AlInGaP or AlGaAs barrier layers. Spacer layers can further be provided between the individual quantum wells.

The term "quantum well structure" in the context of the application encompasses any structure in which charge carriers undergo quantization of their energy states by confinement. In particular, the term "quantum well structure" carries no implication as to the dimensionality of the quantization. It therefore includes, among other things, quantum wells, quantum wires and quantum dots and any combination of these structures.

Further suitable as active layer 4 is, for example, a p-doped InGaP layer embedded between two AlGaInP layers.

This is followed, viewed in the vertical direction, by a p-doped first cladding layer 5, a current-conducting layer 6 that is n-doped in the current-blocking regions 12 and p-doped in the current permeable region 13, and a p-doped second cladding layer 7. These three semiconductor layers 5, 6 and 7 can contain for example AlGaAs or AlGaInP. A blocking npn junction, i.e. two opposite pn junctions connected in series, is thereby formed in the current-blocking regions 12.

The lateral width of the current-permeable region 13 is so selected according to the invention that the current-permeable region overlaps with the defined resonator volume 14 of the external resonator, the current-permeable region preferably being wider than the lateral cross section of the resonator volume 14 in the region of current-conducting layer 6. In the exemplary embodiment shown, the resonator volume is determined in particular by the resonator length in combination with the radius of curvature of the external mirror 11. In case of doubt, the boundary of the resonator in the present invention can be taken in a gaussian approximation as the $1/e^2$ radius of the field of the fundamental electromagnetic mode.

Figure 2A:
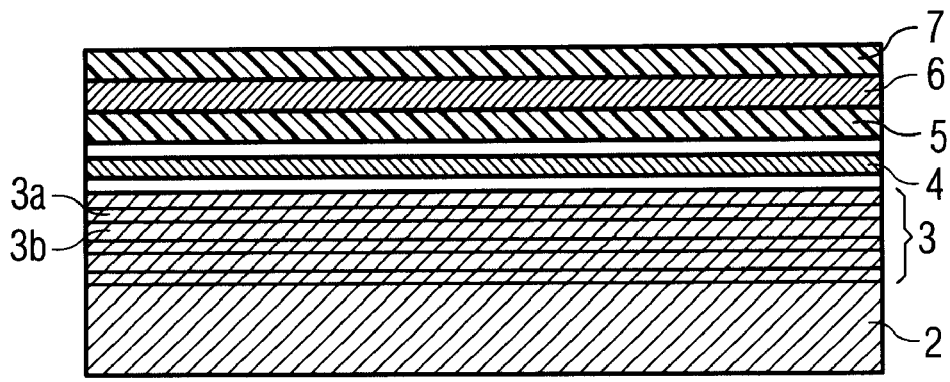
FIGS. 2a, 2b, and 2c is a schematic depiction of an exemplary embodiment of an inventive production method in the light of three intermediate steps.
Figure 2B:
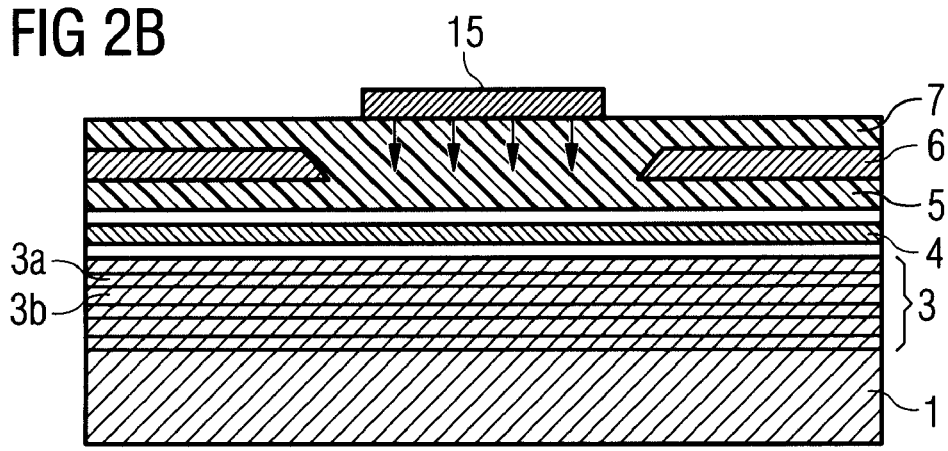
Figure 2C:
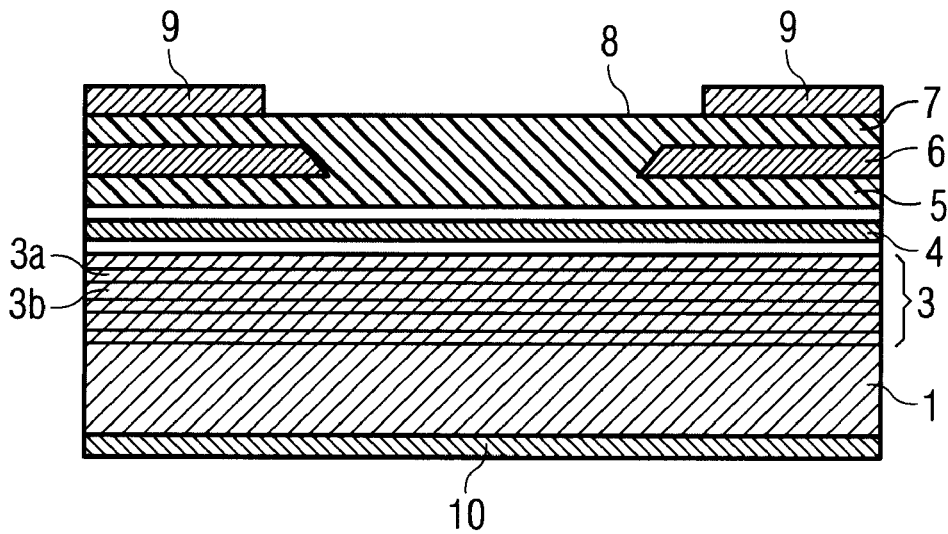

FIGS. 2a, 2b and 2c illustrate a production method for the semiconductor body shown in FIG. 1 in the light of three intermediate steps.

In a first step (FIG. 2a), grown epitaxially on a substrate 2 is, first, a mirror structure 3 comprising a sequence of layer pairs 3a, 3b having different indexes of refraction, an active layer 4, a first cladding layer 5, a current-conducting layer 6 and a second cladding layer 7. First cladding layer 5 is of a first conduction type throughout, current-conducting layer 6 is of a second conduction type throughout, and second cladding layer 7 is of the first conduction type throughout. For example, first cladding layer 5 can be p-doped, current-conducting layer 6 n-doped and second cladding layer 7 again p-doped.

In a second step (FIG. 2b), the current-blocking region 12 and the current-permeable region 13 of current-conducting layer 6 are formed. To this end, a dopant source 15 is applied in a structured manner to the second cladding layer 7 in a region that is disposed after current-permeable region 13 in the vertical direction. The dopant source 15 contains a dopant of the first conduction type, which is subsequently diffused into the layers thereunder and particularly into current-conducting layer 6. The doping takes place in such a way that the conduction type is reversed in current-permeable region 13 of current-conducting layer 6. A vertical current path of the first conduction type is thereby formed in the current-permeable region. A suitable dopant for the above-cited semiconductor materials is zinc, for example.

In a third step (FIG. 2c), an electrical contact 9, for example a ring contact, is subsequently formed on the radiation-decoupling face 8 of the semiconductor body, and a continuous electrical contact 10 corresponding thereto is formed on the opposite face of the semiconductor body. The ring contact is in the process arranged so that the ring opening is disposed after the current-permeable region 13 in the vertical direction. This ensures that contact 9 will not encroach on the provided resonator volume and adversely affect the decoupling of radiation from the semiconductor body.

The explanation of the invention with reference to the exemplary embodiments should not be construed as limiting the invention thereto. In particular, the present invention is not limited to the cited semiconductor materials, and the layers of the semiconductor body can therefore also contain another material, such as, for example, $In_xAl_yGa_{1-x-y}As$ wherein $0 \leq x \leq 1$, $0 \leq y \leq 1$ and $0 \leq x+y \leq 1$, $In_xAl_yGa_{1-x-y}P$ wherein $0 \leq x \leq 1$, $0 \leq y \leq 1$ and $0 \leq x+y \leq 1$, $In_xAl_yGa_{1-x-y}N$ wherein $0 \leq x \leq 1$, $0 \leq y \leq 1$ and $0 \leq x+y \leq 1$, $In_xAl_yGa_{1-x-y}As_uN_{1-u}$ wherein $0 \leq x \leq 1$, $0 \leq y \leq 1$, $0 \leq x+y \leq 1$ and $0 \leq u \leq 1$, $In_xAl_yGa_{1-x-y}As_uP_{1-u}$ wherein $0 \leq x \leq 1$, $0 \leq y \leq 1$, $0 \leq x+y \leq 1$ and $0 \leq u \leq 1$, and/or $In_xAl_yGa_{1-x-y}P_uN_{1-u}$ wherein $0 \leq x \leq 1$, $0 \leq y \leq 1$, $0 \leq x+y \leq 1$ and $0 \leq u \leq 1$.

The present invention further encompasses all combinations of the features recited in the exemplary embodiments and the rest of the description, even if these combinations are not the subject matter of a claim.

What is claimed is:

1. A method of producing a radiation-emitting semiconductor body with a vertical emission direction, the method comprising:

forming a semiconductor body including an active layer and a current-conducting layer positioned between a first cladding layer and a second cladding layer, a. the first cladding layer having a first conduction type, b. the current-conducting layer having a current blocking region of a second conduction type and a current-permeable region of the first conduction type; and c. the second cladding layer having the first conduction type; and forming a laser resonator containing at least a portion of the semiconductor body to produce the radiation-emitting semiconductor body forming the current-conducting layer having a second conduction type throughout the current-conducting layer, the current-conducting layer being formed over the first cladding layer in the vertical emission direction;

forming the second cladding layer having the first conduction type throughout the second cladding layer, the second cladding layer being formed over the current-conducting layer in the vertical emission direction;

applying a dopant source including a dopant of the first conduction type to the second cladding layer and diffusing the dopant into the current-conducting layer to form the current-permeable region by reversing the conduction type within a portion of the current-conducting layer, forming a vertical current path in the semiconductor body through the first cladding layer, the current-permeable region of the current-conducting layer and the second cladding layer.

2. The method of claim 1, where the current-conducting region is doped throughout with a dopant of the second conduction type prior to applying the dopant of the first conduction type to form the current-permeable region.

3. The method of claim 1, where the first cladding layer and the second cladding layer are formed as p-doped materials and the current-conducting layer comprises a n-doped material in the current-blocking region and a p-doped material in the current-permeable region.

4. The method of claim 3, where each of the first cladding layer, the current-conducting layer and the second cladding layer comprise a material selected from the group consisting of: AlGaAs and AlGaInP.

5. The method of claim 1, further comprising forming a mirror structure within the semiconductor body, the active layer comprising a quantum well structure positioned between the mirror layer and the portion of the semiconductor body comprising the first cladding layer, the current-conducting layer and the second cladding layer.

6. The method of claim 5, where the mirror structure is formed as a Bragg mirror with a plurality of alternating semiconductor layers having different indices of refraction.

7. The method of claim 6, where the semiconductor body further comprises a substrate and the mirror structure is formed by epitaxially growing the plurality of alternating semiconductor layers on the substrate.

8. The method of claim 7, further comprising growing the active layer, the first cladding layer, the current-conducting layer and the second cladding layer between a radiation decoupling surface and the substrate.

9. The method of claim 6, where the mirror structure comprises a plurality of alternating GaAs and/AlGaAs layers.

10. The method of claim 5, where the active layer contains at least one material selected from the group consisting of: InGaP, InGaAs, GaAs, AlInGaP and AlGaAs.

11. The method of claim 5, where the active layer comprises a p-doped InGaP layer embedded between two AlGaInP layers.

12. The method of claim 1, further comprising forming a mirror structure within the semiconductor body, the active layer comprising a quantum well structure positioned between the mirror layer and the portion of the semiconductor body comprising the first cladding layer, the current-conducting layer and the second cladding layer.

13. The method of claim 12, where the dopant source comprises zinc.

14. The method of claim 1, where semiconductor body comprises a plurality of layers including the first cladding layer, the current-conducting layer and the second cladding layer, each layer formed from a material selected from the group consisting of:

a. $In_xAl_yGa_{1-x-y}As$ wherein $0 \leq x \leq 1$, $0 \leq y \leq 1$ and $0 \leq x+y \leq 1$, b. $In_xAl_yGa_{1-x-y}P$ wherein $0 \leq x \leq 1$, $0 \leq y \leq 1$ and $0 \leq x+y \leq 1$, c. $In_xAl_yGa_{1-x-y}N$ wherein $0 \leq x \leq 1$, $0 \leq y \leq 1$ and $0 \leq x+y \leq 1$, d. $In_xAl_yGa_{1-x-y}As_uN_{1-u}$ wherein $0 \leq x \leq 1$, $0 \leq y \leq 1$, $0 \leq x+y \leq 1$ and $0 \leq u \leq 1$, e. $In_xAl_yGa_{1-x-y}As_uP_{1-u}$ wherein $0 \leq x \leq 1$, $0 \leq y \leq 1$, $0 \leq x+y \leq 1$ and $0 \leq u \leq 1$; and f. $In_xAl_yGa_{1-x-y}P_uN_{1-u}$ wherein $0 \leq x \leq 1$, $0 \leq y \leq 1$, $0 \leq x+y \leq 1$ and $0 \leq u \leq 1$.

15. A method for producing a radiation-emitting semiconductor body with a vertical emission direction, the method comprising:
   a. providing a growth substrate,
   b. epitaxially growing an active layer comprising a quantum well structure over the growth substrate, and
   c. forming a current-conducting layer with a current-blocking region over the active layer, wherein forming the current-conducting layer comprises:
      i. growing a first cladding layer of a first conduction type,
      ii. growing the current-conducting layer of a second conduction type,
      iii. growing a second cladding layer of the first conduction type, and
   d. doping the current-conducting layer with a dopant to form a current-permeable region within the current-conducting layer by increasing the dopant concentration within a portion of the current-conducting layer to cause the current-permeable region to be of the first conduction type; the current permeable region being configured to overlap with a defined resonator volume of an external resonator to form a vertical emitting laser.

16. The method of claim 15, wherein the doping of the current-conducting layer includes applying a dopant source comprising the dopant to the second cladding layer in a region formed over the current-conducting layer in the vertical emission direction, the dopant being subsequently diffused into the current-permeable region, to form the current-permeable region within the current-conducting layer.

17. The production method of claim 16, where the dopant source is removed after the diffusion of the dopant into the current-conducting layer.

18. The production method of claim 15, wherein the dopant is zinc.

19. A method of producing a radiation-emitting semiconductor body with a vertical emission direction, the method comprising:
   a. forming a semiconductor body having a plurality of layers and formed by one or more steps including
      i. epitaxially growing an active layer comprising a quantum well structure over a growth substrate, and
      ii. forming a current-conducting layer with a current-blocking region and a current-permeable region over the active layer, wherein forming the current-conducting layer comprises:
         1. growing a first cladding layer of a first conduction type formed over the active layer in the vertical emission direction,
         2. growing the current-conducting layer of a second conduction type formed over the first cladding layer in the vertical emission direction, and
         3. growing a second cladding layer of the first conduction type over the current-conducting layer in the vertical emission direction;
      the semiconductor body comprising a plurality of layers including the first cladding layer, the current-conducting layer and the second cladding layer formed from a material selected from the group consisting of:
         i. $In_xAl_yGa_{1-x-y}As$ wherein $0 \leq x \leq 1$, $0 \leq y \leq 1$ and $0 \leq x+y \leq 1$,
         ii. $In_xAl_yGa_{1-x-y}P$ wherein $0 \leq x \leq 1$, $0 \leq y \leq 1$ and $0 \leq x+y \leq 1$,
         iii. $In_xAl_yGa_{1-x-y}N$ wherein $0 \leq x \leq 1$, $0 \leq y \leq 1$ and $0 \leq x+y \leq 1$,
         iv. $In_xAl_yGa_{1-x-y}As_uN_{1-u}$ wherein $0 \leq x \leq 1$, $0 \leq y \leq 1$, $0 \leq x+y \leq 1$ and $0 \leq u \leq 1$,
         v. $In_xAl_yGa_{1-x-y}As_uP_{1-u}$ wherein $0 \leq x \leq 1$, $0 \leq y \leq 1$, $0 \leq x+y \leq 1$ and $0 \leq u \leq 1$; and
         vi. $In_xAl_yGa_{1-x-y}P_uN_{1-u}$ wherein $0 \leq x \leq 1$, $0 \leq y \leq 1$, $0 \leq x+y \leq 1$ and $0 \leq u \leq 1$;
   b. applying a dopant source including a dopant of the first conduction type to the second cladding layer;
   c. diffusing the dopant into the current-conducting layer to form the current-permeable region by reversing the conduction type within a portion of the current-conducting layer, to form a vertical current path in the semiconductor body through the first cladding layer, the current-permeable region of the current-conducting layer and the second cladding layer; and
   d. forming a laser resonator containing at least the current-permeable region of the current-conducting layer of the semiconductor body and the quantum well structure to produce the radiation-emitting semiconductor body.

* * * * *